(12) United States Patent
Fung

(10) Patent No.: US 7,235,846 B2
(45) Date of Patent: Jun. 26, 2007

(54) ESD PROTECTION STRUCTURE WITH SIGE BJT DEVICES

(75) Inventor: Greg Fung, Fremont, CA (US)

(73) Assignee: WJ Communications, Inc., San Jose, CA (US)

( * ) Notice: Subject to any disclaimer, the term of this patent is extended or adjusted under 35 U.S.C. 154(b) by 178 days.

(21) Appl. No.: 11/116,807

(22) Filed: Apr. 27, 2005

(65) Prior Publication Data

US 2005/0247979 A1  Nov. 10, 2005

Related U.S. Application Data

(60) Provisional application No. 60/567,113, filed on Apr. 30, 2004.

(51) Int. Cl.
H01L 23/62 (2006.01)
H01L 29/72 (2006.01)
H01L 29/74 (2006.01)
H01L 31/111 (2006.01)
H01L 31/119 (2006.01)

(52) U.S. Cl. ............ 257/355; 257/173; 257/174; 257/356; 257/357; 257/358; 257/359; 257/360; 361/362; 361/370

(58) Field of Classification Search ........ 257/173–174, 257/355–363, 370
See application file for complete search history.

(56) References Cited

U.S. PATENT DOCUMENTS 6,803,259 B2 * 10/2004 Lee .............................. 438/133

6,815,800 B2 * 11/2004 Mallikarjunaswamy ..... 257/565
6,984,870 B2 *  1/2006 Kinayman ................... 257/539
2005/0085028 A1 *  4/2005 Chatty et al. ............... 438/200
2005/0225910 A1 * 10/2005 Stricker et al. ............... 361/56

OTHER PUBLICATIONS

Shiao-Shien Chen et al., "Investigation of ESD Devices in 0.18-μm SiGe BiCMOS Process", IEEE 41st Annual International Reliability Physics Symposium, Dallas Texas (2003) pp. 357-360.
J. Dunn et al., "Trends in Silicon Germanium BiCMOS Integration and Reliability", IEEE, TH Annual International Reliability Physics Symposium, San Jose California, (20000) pp. 237-242.

(Continued)

*Primary Examiner*—Ida M. Soward
(74) *Attorney, Agent, or Firm*—Morgan Lewis & Bockius

(57) ABSTRACT

The present invention provides an ESD protection device or structure that exploits the high conductivity of a heavily doped heterojunction base of a standard SiGe bipolar junction transistor (BJT) cell. This improved ESD protection scheme further uses the combination of trench isolation and buried subcollector layer of the SiGe BJT to confine ESD current, minimizing parasitic substrate leakage and achieving large forward voltages while imposing minimal parasitic capacitive loads on a protected active device. Since the ESD protection structure is formed from conventional SiGe BJT transistor cells through modification of the contact metallization, it can be fabricated in an available SiGe BiCMOS fabrication process without additional processing steps, and characterization data already available for the SiGe BJTs can be used to model the performance of the ESD protection devices.

16 Claims, 8 Drawing Sheets

OTHER PUBLICATIONS

Steven H. Voldman et al., "The Influence of Process and Design of Subcollectors on the ESD Robustness of ESD Structures and Silicon Germanium Heterojunction Bipolar Transistors in a BiCMOS SiGe Technology", IEEE, 03CH37400, 41$^{ST}$ Annual International Reliability Physics Symposium, Dallas Texas, (2003) pp. 347-356.

Steven H. Voldman et al., "Silicon Germanium Heterojunction Bipolar Transistor Electrostatic Discharge Power Clamps and the Johnson Limit in RF BICMOS SiGe Technology", Elsevier Science, Journal of Electrostatics, vol. 56, (2002), pp. 341-362.

Steven H. Voldman, "The State of the Art of Electrostatic Discharge Protection: Physics, Technology, Circuits, Design, Simulation, and Scaling", IEEE Journal of Solid-State Circuits, vol. 34, No. 9, (1999) pp. 1272-1282.

Albert Wang, "Recent Developments in ESD Protection for RFIC's", IEEE (2003) pp. 171-178.

* cited by examiner

ESD PROTECTION STRUCTURE WITH SIGE BJT DEVICES

CROSS REFERENCE TO RELATED APPLICATIONS

The present application claims the benefit of and priority to U.S. Provisional Patent Application No. 60/567,113 entitled "ESD Protection Structure for SiGe BJT Devices with Low Parasitic Capacitance and Low Leakage Current," filed on Apr. 30, 2004, the entire disclosure of which is incorporated herein by reference.

FIELD OF THE INVENTION

The present invention relates in general to electrostatic discharge (ESD) protection techniques and particularly to an ESD protection structure for protecting high-performance input devices in mixed-signal SiGe BiCMOS circuitry from ESD damages.

BACKGROUND OF THE INVENTION

The need to protect integrated circuit input and output ports from damages caused by electrostatic discharge is well known, and various types of structures have been employed for this purpose. One type of structure employs metal-oxide-semiconductor field-effect transistors (MOSFETs) with grounded gates. One or more parasitic bipolar devices associated with the MOSFET act to provide a leakage path at high input voltages to protect subsequent circuitry. See, for example, "Recent Developments in ESD Protection for RF IC's", by Wang, Design Automation Conference, 2003, Proceedings of the ASP-DAC 2003, page 171 Wang; and "On-Chip ESD Protection for Integrated Circuits," A. Wang, Kluwer Academic, 2002. However, this type of ESD protection structure may present a large parasitic capacitive load to the protected device, and may thus be unsuitable for high-performance devices operating at high frequencies, such as, for example, 2.4 or 5.2 GHz for wireless local area networks.

Another type of ESD structure employs stacked diodes constructed from, for example, P+ diffusions and n-wells, as shown in FIG. 1. Although FIG. 1 only shows three stages of stacked diodes, a larger number of these diodes could be employed depending on the requirements of the application. As discussed by Voldman in "the State of the Art of Electrostatic Discharge Protection", IEEE J Solid-State Ckcts 34 #9 September 1999, a parasitic leakage path formed by parasitic bipolar transistors associated with the structure for injected minority carriers through the n-well into the substrate causes some of the ESD current of each diode to be shunted to the substrate, as shown by the equivalent circuit in FIG. 1. As a consequence, a forward voltage between an I/O pad and a power rail or ground for a given input current is greatly reduced, and high trigger voltages are not achievable at small leakage currents.

In "Investigation of ESD Devices in 0.18 micron SiGe BiCMOS Process", 41$^{st}$ Annual Reliability Physics Symposium, Dallas, Tex., 2003, p. 357, Chen et. al. have proposed the use of a modified structure of stacked-diodes, each having a P+ diffusion and a N+ diffusion separated by a shallow trench isolation (STI) in a P-well, and a buried N+ layer below the P-well, as shown in FIG. 2. The diodes are separated from both shallow and deep trench isolations. The structure illustrated in FIG. 2 avoids the limitations of the conventional stacked-diode structure shown in FIG. 1 by eliminating parasitic currents to the substrate, as shown by the equivalent circuit in FIG. 2. This modified structure causes the base of the parasitic bipolar transistor to move to the N+ buried layer under the P-well, and thus results in a considerable increase in the forward voltage for a fixed leakage current. The forward voltage, however, is still limited by the voltage drop in the shallow P-well region between the buried N+ layer and the shallow-trench isolation between the P+ and N+ diffusion regions. Furthermore, this structure is designed specifically for ESD protection and requires separate processing steps and characterization in addition to those required for fabricating the protected circuit.

Therefore, there is need for an ESD protection scheme for high-performance radio-frequency input ports, which provides high hold-off (or trigger) voltages with low leakage and minimal parasitic capacitance, and which is can be constructed during processing of the protected circuits without the need for additional processing steps.

SUMMARY OF THE INVENTION

The present invention provides an ESD protection device or structure that exploits the high conductivity of a heavily doped heterojunction base of a standard SiGe bipolar junction transistor (BJT) cell. This improved ESD protection scheme further uses the combination of trench isolation and buried subcollector layer of the SiGe BJT to confine ESD current, minimizing parasitic substrate leakage and achieving large forward voltages while imposing minimal parasitic capacitive loads on a protected active device. Since the ESD protection structure is formed from conventional SiGe BJT transistor cells through modification of the contact metallization, it can be fabricated in an available SiGe BiCMOS fabrication process without additional processing steps, and characterization data already available for the SiGe BJTs can be used to model the performance of the ESD protection devices.

In one embodiment, the ESD protection device or structure is used to protect an active circuit coupled to an input/output (I/O) pad, and comprises stacked diodes coupled between an I/O pad and a positive or negative supply rail, the stacked diodes being formed using a plurality of SiGe bipolar junction transistors (BJT) each having a P-type doped SiGe base formed over a substrate, wherein an anode of each diode is formed using the SiGe base of one of the SiGe bipolar junction transistors. An emitter of each SiGe bipolar junction transistor is either left floating or is connected to the base of the SiGe BJT, while the collector of the SiGe BJT is connected to the base of a neighboring SiGe BJT.

The embodiments of the present invention also provides a method of fabricating an ESD protection structure for protecting an I/O device in a mixed-signal SiGe BiCMOS circuit. The method comprises forming a plurality of trench isolation regions separated by active regions in a P-type substrate, forming a doped SiGe base over each active region, and forming a plurality of metal lines over the substrate, the plurality of metal lines comprising a first metal line connecting a first SiGe base to the I/O pad. The method further comprises, before forming the doped SiGe base, forming a buried N+ region in each active region and forming a N+ contact region over the buried N+ region in each active region. The plurality of metal lines further comprises a second metal line connecting a second SiGe base to a N+ contact region formed in a neighboring active region, and a third metal line connecting an N+ contact region to a positive or negative supply rail associated with the circuit.

DETAILED DESCRIPTION OF THE EMBODIMENTS

The ESD protection structure according to embodiments of the present invention comprises a stacked-diode structure formed using SiGe bipolar junction transistors (BJT), with the anode of each diode corresponding to a SiGe base of each SiGe BJT. Unlike a conventional bipolar transistor, which typically has a lightly-doped base region to ensure good emitter injection efficiency at the cost of poor lateral conductivity in the base region, the SiGe base of the SiGe BJT in the ESD structure are heavily-doped with, for example, P-type dopants. The use of a conventional lightly-doped base would cause a forward resistance of the ESD structure to be excessive, resulting in insufficient ESD protection.

Figure 3A:
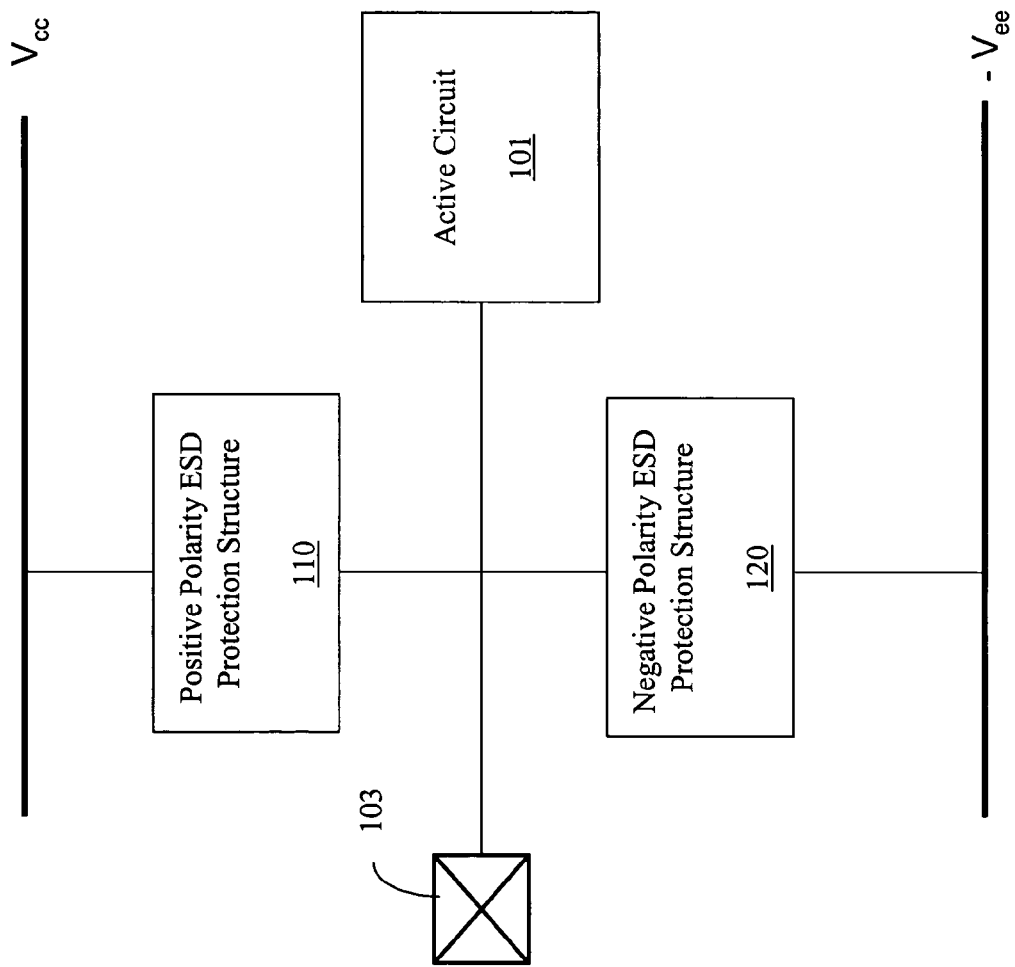
FIG. 3A is a block diagram of an input circuit with ESD input clamps to both a positive rail and a negative rail according to one embodiment of the present invention.

In one embodiment, the ESD structure is used to protect an active circuit in a mixed-signal SiGe BiCMOS integrated circuit (IC) device. As shown in FIG. 3A, the active circuit 101 is coupled to an I/O pad 103, and a positive polarity ESD protection structure 110 is coupled between the I/O pad and a positive power supply rail $V_{cc}$ to provide an I/O clamp to the positive supply rail, thus protecting the active circuit 101 against positive polarity ESD pulses having voltages greater than the positive rail voltage $V_{cc}$. Additionally, or alternatively, a negative polarity ESD protection structure 120 is coupled between the I/O pad and a negative supply rail $-V_{ee}$ (e.g., ground) to provide an I/O clamp to the negative rail, thus protecting the active circuit 101 against negative polarity ESD pulses having negative voltages with magnitudes greater than $V_{ee}$.

Figure 3B:
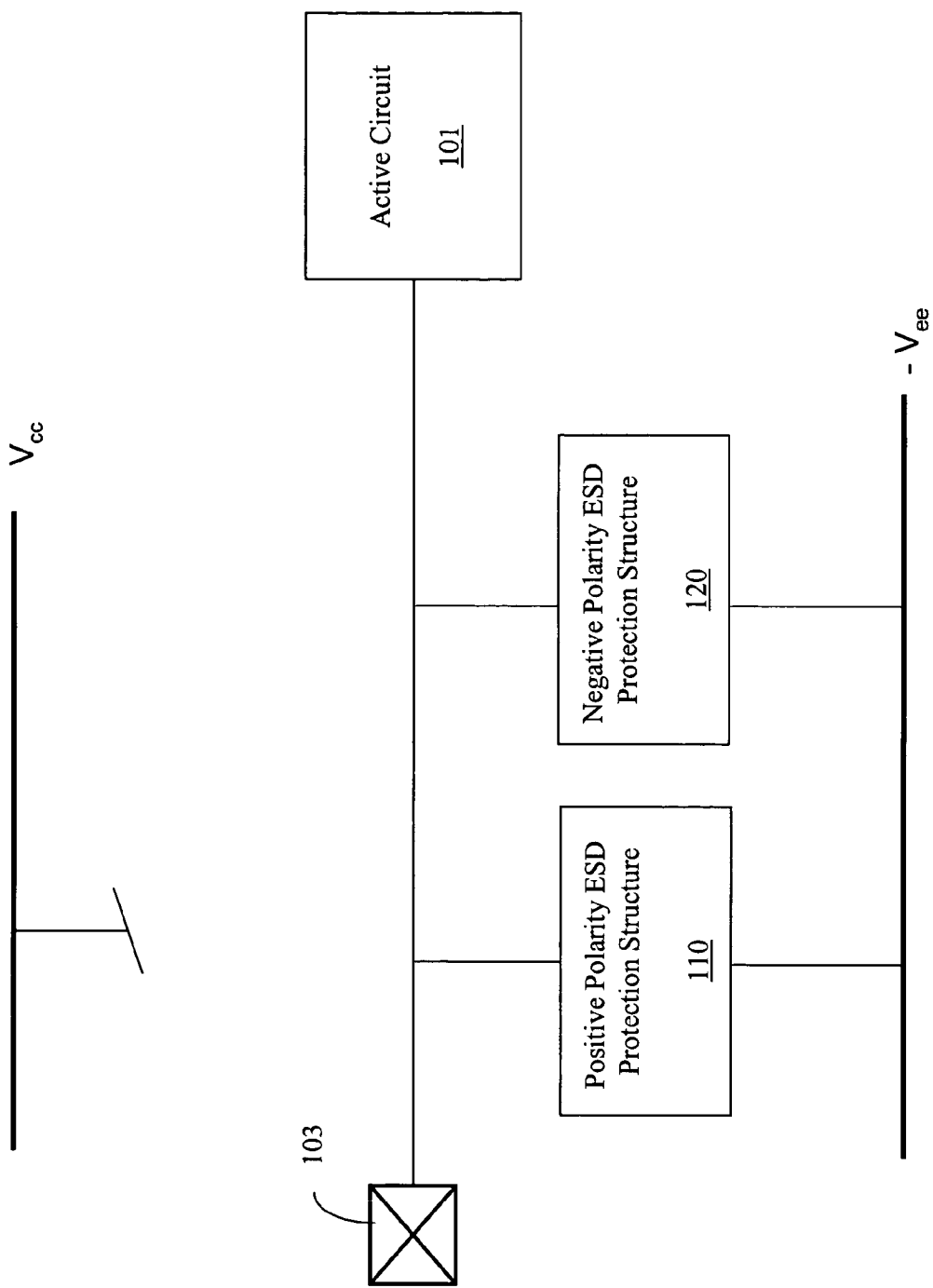
FIG. 3B is a block diagram of an input circuit with ESD input clamps to only the negative rail according to one embodiment of the present invention.

Alternatively, I/O clamps to the negative supply rail $-V_{ee}$ for both positive and negative polarity ESD pulses can be made without accessing the positive power supply rail $V_{cc}$. As shown in FIG. 3B, the active circuit 101 can be protected against positive and/or negative polarity ESD pulses by positive and/or negative polarity ESD protection structures 110 and/or 120, respectively, either or both being coupled between the I/O pad 103 and the negative supply rail $-V_{ee}$.

Figure 4A:
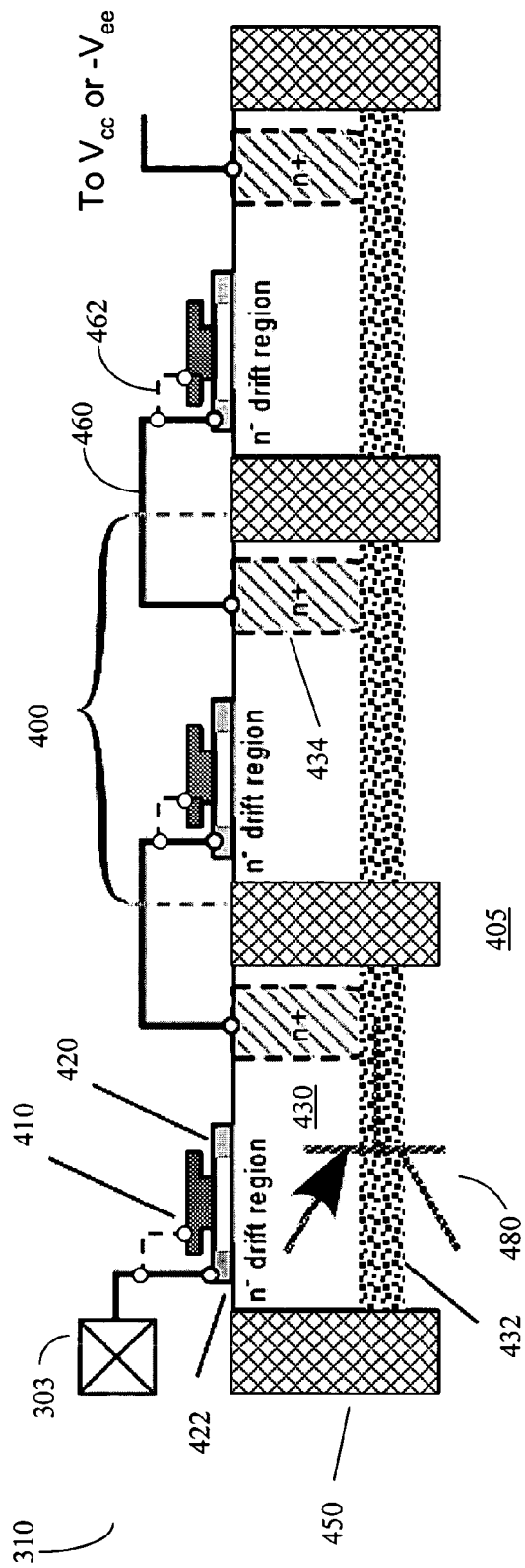
FIG. 4A is a block diagram of a positive polarity ESD protection structure built using SiGe BJT according to one embodiment of the present invention.

The positive polarity ESD protection structure 310 comprises a diode stack forming using SiGe BJTs. As shown in FIG. 4A, the positive polarity ESD protection structure 310 comprises a plurality of SiGe BJT cells 400 each having an emitter 410 formed over a substrate 405, a SiGe base 420 between the emitter 410 and the substrate 405, a drift region 430 formed in the substrate under the SiGe base 420, a subcollector 432 comprising a buried diffusion region 432 formed under the drift region 430, and a subcollector contact region 434 adjacent the drift region 430 and in contact with the buried diffusion region 432. Trench isolations 450 are provided to separate each SiGe BJT cell 400 from neighboring SiGe BJT cell(s). Although FIG. 4A only shows three SiGe BJT cells, there can be a number n of these SiGe BJT cells, where n is a positive number.

In one embodiment, the positive polarity ESD protection structure 310 further comprises conductive lines connecting the SiGe base 420 of a first one of the BJT cells to the I/O pad 303, the SiGe base 420 of a second one of the BJT cells to the subcollector contact 434 of the first one of the BJT cells, the SiGe base 420 of a third one of the BJT cells to the subcollector contact 434 of the second one of the BJT cells, . . . , the SiGe base 420 of an $n^{th}$ (or last) one of the BJT cells to the subcollector contact 434 of the $(n-1)^{th}$ one of the BJT cells, and the subcollector contact 434 of the $n^{th}$ one of the BJT cells to the positive supply rail $V_{cc}$ or the negative supply rail $-V_{ee}$, as shown in FIG. 3A or FIG. 3B. The SiGe base 420 in each BJT cell 400 may comprise a base contact region 422 to facilitate the above connections. The emitter 410 of each SiGe BJT 400 can be left open or be connected to the SiGe base 420 of the BJT through another set of conductive lines, as shown by the dashed lines 462. The substrate 405 can be connected to a voltage source $V_{sub}$, which can be $-V_{ee}$ or ground, through another conductive line and a substrate contact region (not shown).

In one embodiment of the present invention, the emitter is made of a semiconductor material, such as heavily doped polysilicon or amorphous silicon. The SiGe base 420 is also heavily doped with dopants having a different polarity than those used to dope the emitter 410. The drift region 430 is lightly doped with dopants having the same polarity as those used to dope the emitter 410 while the subcollector 432 and subcollector contact 434 are heavily doped also with dopants having the same polarity as those used to dope the emitter 410. In one embodiment, the substrate 405 is a P-type silicon substrate, and the emitter 410, the drift region 430, the subcollector 432, and the subcollector contact 434 are doped with N-type dopants, while the SiGe base 420 is doped with P-type dopants. The invention, however, is not limited by the polarity of these dopants, as they can be reversed in different applications.

The heavily doped SiGe base 420 of each BJT cell is used as an anode of a diode in the diode stack, while the lightly doped drift region 430 and the heavily doped subcollector 432 and subcollector contact 434 of the BJT cell in combination are used as the cathode of the diode in the diode stack. The incorporation of the subcollector into the cathode ensures good lateral conductivity of the diode. In addition, the combination of the lightly doped N− drift region 430 and the heavily-doped N+ subcollector region 432 provides a very low recombination lifetime for injected holes from the SiGe base 420, so that very few of these holes are able to reach the substrate 405 to form parasitic current.

Alternatively, the emitter-base junction in each SiGe BJT cell 400 can be used as a diode in the diode stack in the ESD protection structure 310, but this approach is not preferred because the highly doped emitter 410 and SiGe base 420 may result in a large parasitic capacitance during normal operation of the protected active circuit 301. In addition, the contact area between the emitter 410 and base 420 of a standard SiGe BJT can be small, which may result in more current crowding and a larger series on-resistance.

Figure 4B:
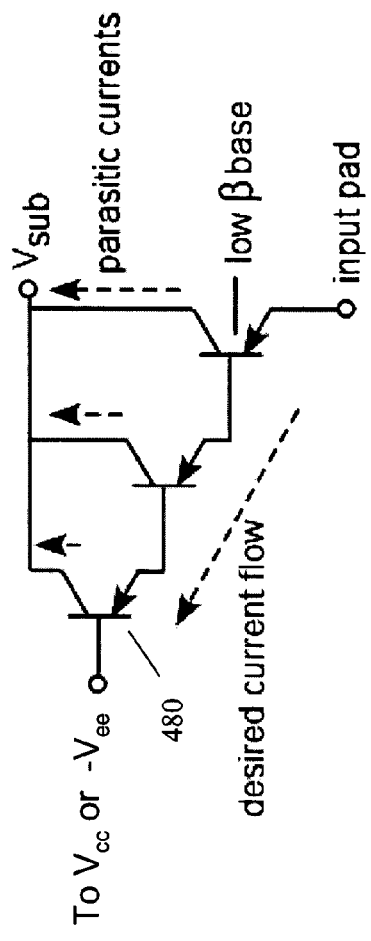
FIG. 4B is a circuit schematic of an equivalent circuit formed by parasitic bipolar transistors associated with the positive polarity ESD protection structure.

Thus, a diode stack is formed between the I/O pad 303 and $V_{cc}$ or $-V_{ee}$ using the plurality of SiGe BJT cells 400. In response to a positive polarity ESD pulse on the I/O pad 303, the diode stack should turn on, causing ESD current to flow from the SiGe base 420 of the first one of the SiGe BJT cells to the subcollector contact 434 of the last one of the SiGe BJT cells. In practice, there may be parasitic currents flowing from the N− drift region 430 in each SiGe BJT cell 400 to the substrate 405. The parasitic current results from parasitic PNP bipolar transistors 480 each formed by the SiGe base 420 acting as an emitter of the parasitic PNP bipolar transistor, the drift region 430 and the subcollector 432 acting as the base of the parasitic PNP bipolar transistor, and the substrate 405 acting as the collector of the parasitic PNP bipolar transistor, as shown in FIG. 4B. The current amplification β of each parasitic PNP bipolar transistor, however, is low because the base of the parasitic PNP bipolar transistor is wide and includes the highly doped subcollector region 432. Preferably, through reasonable design of the SiGe BJT cell 400, β is less than 1. As a consequence, there is little parasitic substrate current, and negligible multiplication effect on the current gain in the parasitic multistage PNP bipolar structure shown in FIG. 4B.

Figure 1:
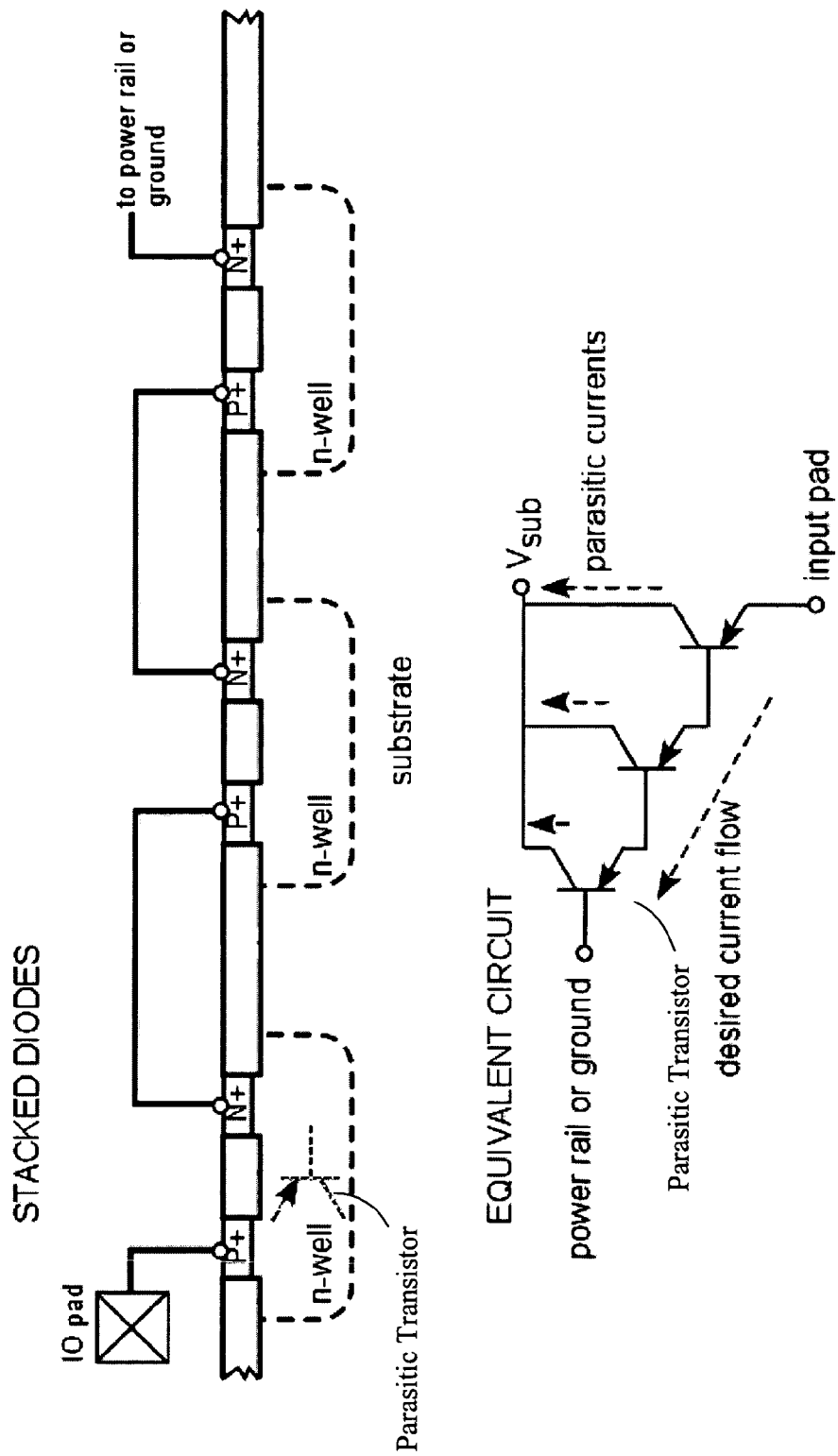
FIG. 1 includes a block diagram of a prior art stacked-diode ESD structure and a circuit schematic showing an equivalent circuit formed by parasitic bipolar transistors associated with the ESD structure.
Figure 2:
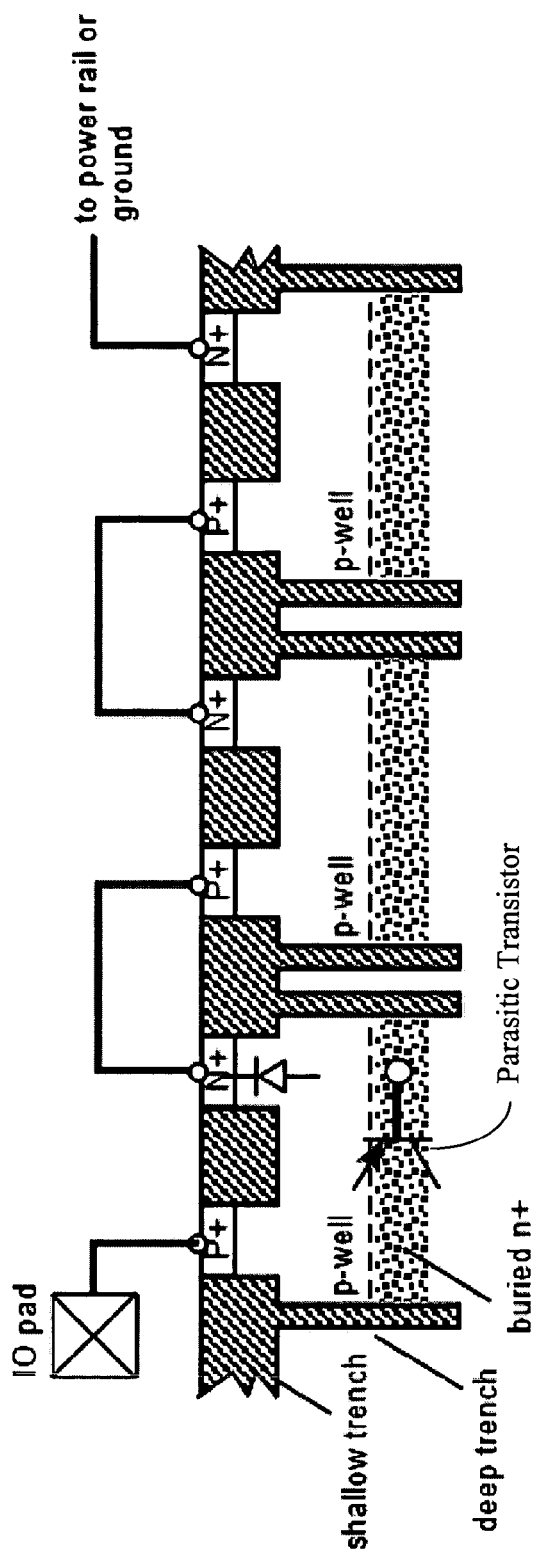
FIG. 2 includes a block diagram of a prior art modified stacked-diode ESD structure and a circuit schematic showing an equivalent circuit formed by parasitic bipolar transistors associated with the modified ESD structure.
Figure 2:
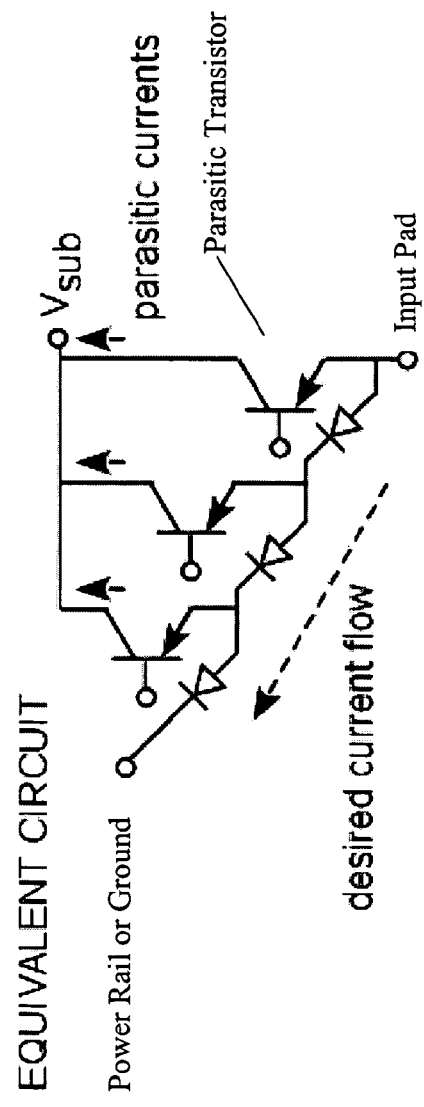
Figure 5:
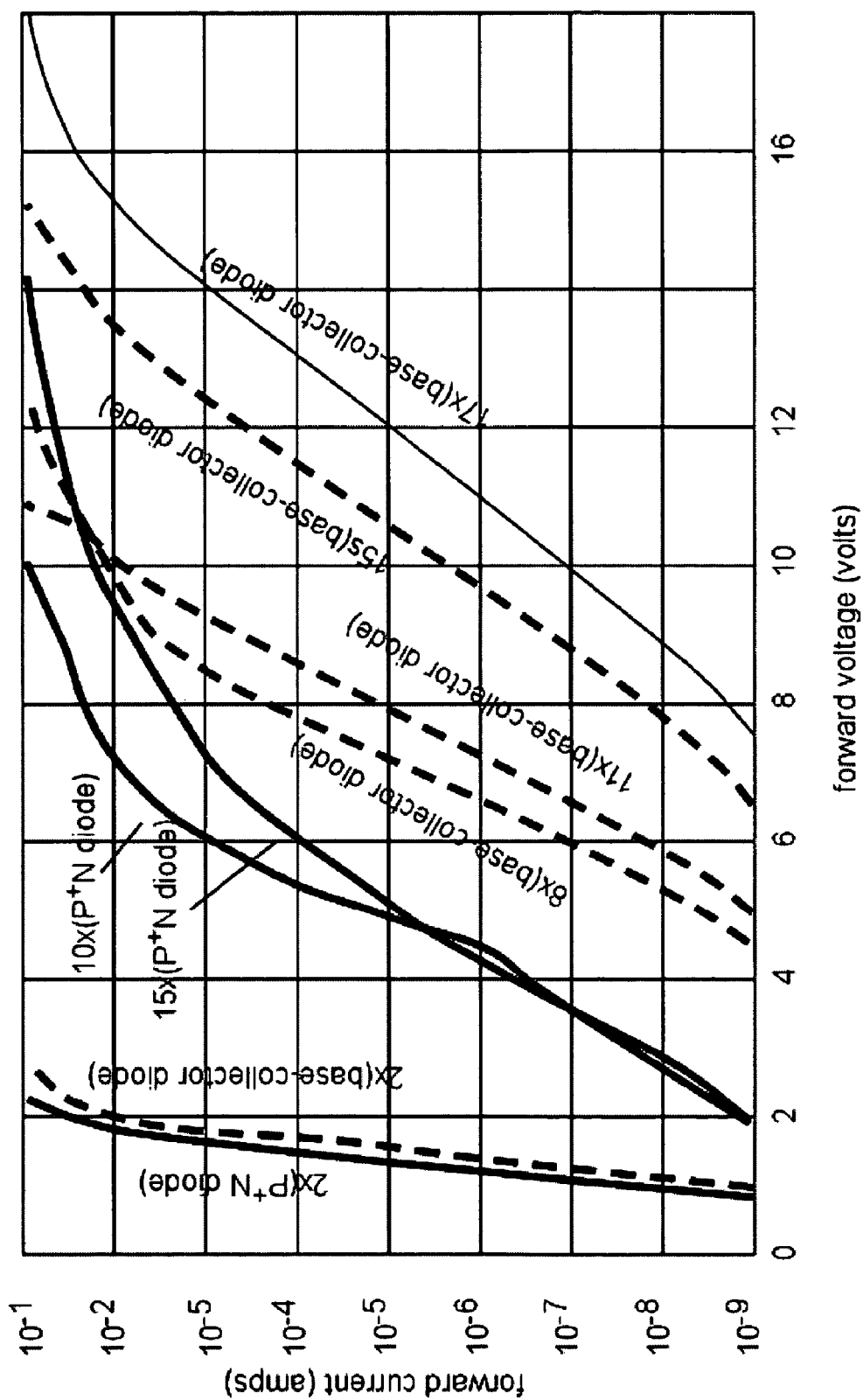
FIG. 5 is a chart illustrating current-voltage characteristics of the ESD structures according to embodiments of the present invention as compared to those of conventional stacked-diode ESD structures.

The performance of the positive polarity ESD protection structure 310 is compared with that of conventional stacked-diode ESD protection structures such as the one shown in FIG. 1. Referring to FIG. 5, the forward current vs. forward voltage plots of conventional structures are labeled 'nx(P+N diode)', wherein n is a positive integer indicating the number of diodes in a stacked-diode structure, while those of the positive polarity ESD protection structure 310 are labeled 'nx(base-collector diode)'. From two to 17 stacked diodes in both the conventional structures and the positive polarity ESD protection structures 310 are examined. It is apparent that for conventional structures, little advantage is gained in the forward voltage for a given forward current by stacking more than a modest number of (e.g., 10) diodes in series. For example, as shown in FIG. 5, a stack of 15 diodes in a conventional stacked diode structure produce little better performance than a stack of 10 diodes, and are only modestly superior to a stack of two diodes. In contract, the positive polarity ESD protection structure 310 provides nearly linear improvements in forward voltage as the number of stacked diodes is increased. As shown in FIG. 5, a forward voltage as high as 11 volts at 1 microampere of forward current can be achieved.

The parasitic capacitance of the positive polarity ESD protection structure 310 is a largely determined by the capacitance of the one-sided PN junction between the relatively heavily-doped SiGe base 420 and the lightly-doped drift region 430. Lower parasitic capacitance values are usually desirable in order to minimize degradation in the performance of the active device due to the addition of the ESD protection structure. Thus, for most applications, the lowest level of doping in the drift region 430 that can be used without excessive drop in the forward voltage should be desirable. A first estimate of the optimal value may be obtained using the well-known formulas for calculating the capacitance and resistance associated with a one-sided junction:

$$C_{par}[1] \approx A \sqrt{\frac{q \kappa \varepsilon_0 N_d}{2(\phi - V)}}$$

$$R_{ser}[1] \approx \frac{w_{drift}}{q \mu_n N_d A}$$

where A is the cross-sectional area of the drift region, $w_{drift}$ is the thickness of the drift region, $N_d$ the doping concentration of the drift region, q the electron charge, μ the electron mobility, κ the relative dielectric constant of the semiconductor, $\varepsilon_o$ the dielectric constant of free space, V the applied junction voltage, and φ the junction build-in voltage. Here $C_{par}$ is the parasitic capacitance of a single diode in the stacked diode structure in positive polarity ESD protection structure 310 and $R_{ser}$ is the series forward resistance of the diode; thus the overall properties of the ESD protection structure are estimated by scaling the capacitance by (1/n) and the resistance by n, where n is the number of stacked diodes in the positive polarity ESD protection structure 310.

The exact forward resistance and parasitic capacitance associated with each stacked diode in the positive polarity ESD protection structure 310 are complex functions of the three-dimensional geometry of the SiGe BJT cell 400, so an accurate value of the optimal doping for a given process and a SiGe BJT cell must be established by empirical testing, possibly in combination with two- or three-dimensional modeling of currents and electric fields within the devices, if available. For a particular fabrication process used in these experiments, the drift region sheet resistance is about 470Ω per square, and the breakdown voltage $BV_{BCO}$ of the PN junction between the SiGe base 420 and subcollector 432 in each SiGe BJT cell is about 12 volts, but other values might be appropriate for different processes and cell structures.

TABLE 1

|  | Number of stacked diodes | Forward voltage (V) | Forward resistance (Ω) | DC failure current (mA) | Parasitic capacitance per diode (pF) |
|---|---|---|---|---|---|
| Conventional Structure | 1 | 0.55 | 1.02 | 474 | 0.066 |
| Positive polarity ESD protection structure 310 | 2 | 1.35 | 8.87 | 390 | 0.107 |
|  | 10 | 6.55 | 10.8 | 194 | 0.107 |
|  | 15 | 9.65 | 14.9 | 264 | 0.107 |

Table 1 demonstrates certain benefits of the positive polarity ESD protection structure 310 as compared to the conventional structure shown in FIG. 1. Table 1 shows that a modest penalty in forward resistance is encountered in the positive polarity ESD protection structure 310 as compared to the conventional structure. Thus, a somewhat larger structure is needed to achieve the same forward resistance as in the conventional structure. Naturally, in stacked structures, the total area of silicon required increases linearly with the number of stacked cells.

Note that the input capacitance of a stacked-diode structure decreases approximately inversely in the number of diodes in the stacked. The decrease in capacitance that can be achieved in practice, however, is limited by the parasitic shunt capacitance of the BJT structures to the substrate. The parasitic shunt capacitance is the capacitance between the subcollector 432 in each SiGe BJT 400 and the substrate 405 or between the SiGe base 410 in each SiGe BJT 400 and the substrate 405, which does not scale with the number of stacked diodes.

Figure 6:
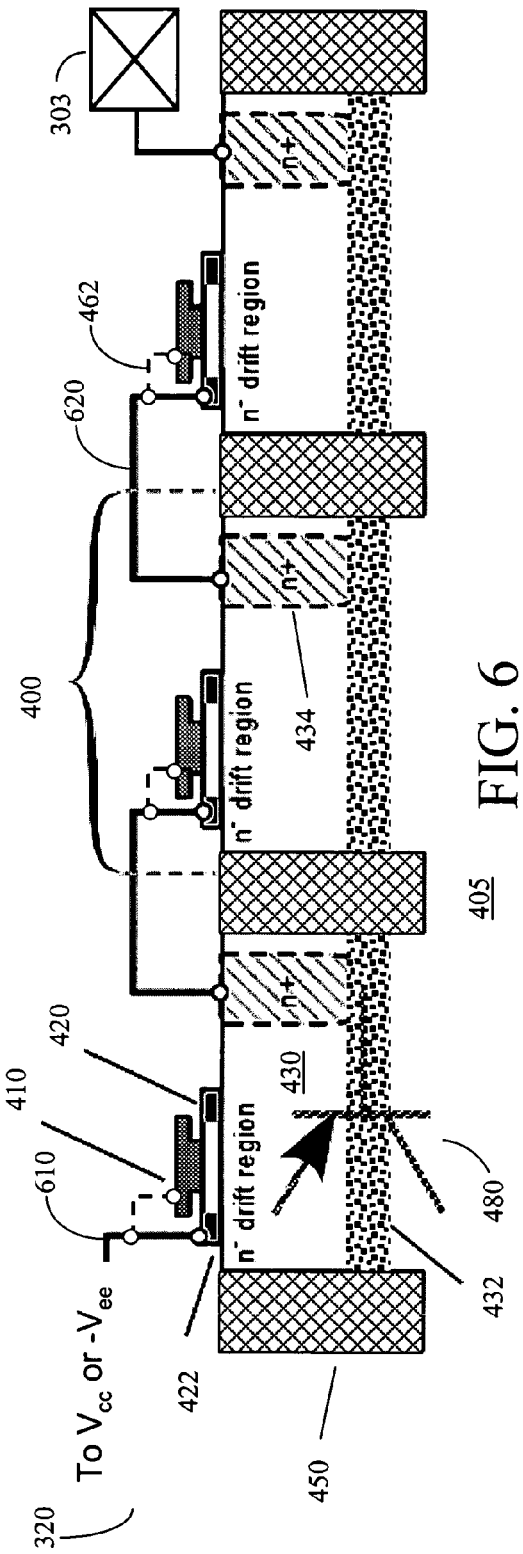
FIG. 6 is a block diagram of a negative polarity ESD protection structure built using SiGe BJT according to one embodiment of the present invention.

The stacked diodes formed using the SiGe BJT cells may also be utilized in the negative polarity ESD protection structure 320 to provide ESD protection against negative polarity ESD pulses on the I/O pad 303. As shown in FIG. 6, the negative polarity ESD protection structure 320 comprises a diode stack formed using a plurality of SiGe BJT cells 400. Again, trench isolations 450 are provided to separate each SiGe BJT cell 400 from neighboring SiGe BJT cell(s). Although FIG. 6 only shows three SiGe BJT cells 400, there can be a number n of these SiGe BJT cells 400, where n is a positive number.

In one embodiment, as shown in FIG. 6, the negative polarity ESD protection structure 320 further comprises conductive lines 610 connecting the SiGe base 420 of a first one of the BJT cells to the negative supply rail $-V_{ee}$, the SiGe base 420 of a second one of the BJT cells to the subcollector contact 434 of the first one of the BJT cells, the SiGe base 420 of a third one of the BJT cells to the subcollector contact 434 of the second one of the BJT cells, ..., the SiGe base 420 of a $n^{th}$ (or last) one of the BJT cells to the subcollector contact 434 of the $(n-1)^{th}$ one of the BJT cells, and the subcollector contact 434 of the $n^{th}$ one of the BJT cells to the I/O pad 303, as shown in FIG. 3A or FIG. 3B. The SiGe base 420 in each BJT cell 400 may comprise a base contact region 422 to facilitate the above connections. The emitter 410 of each SiGe BJT 400 can be left open or be connected to the SiGe base 420 of the BJT through another set of conductive lines, as shown by the dashed lines 462. The substrate 405 can be connected to a voltage source $V_{sub}$, which can be $-V_{ee}$ or ground, through another conductive line and a substrate contact region (not shown).

Thus, a diode stack is formed between the I/O pad 303 and $V_{cc}$ or $-V_{ee}$ using the plurality of SiGe BJT cells 400. In response to a negative polarity ESD pulse on the I/O pad 303, the diode stack should turn on, causing ESD current to flow from the SiGe base 420 of the first one of the SiGe BJT cells to the subcollector contact 434 of the last one of the SiGe BJT cells. In practice, there may be parasitic current flowing from the P-type substrate 405 to the N+ subcollector contact 434 in each SiGe BJT cell 400, but the parasitic current is usually small in this case and simply adds to the ESD conduction during an ESD event. The substrate current will flow through substrate contacts (not shown) to ground.

Figure 7:
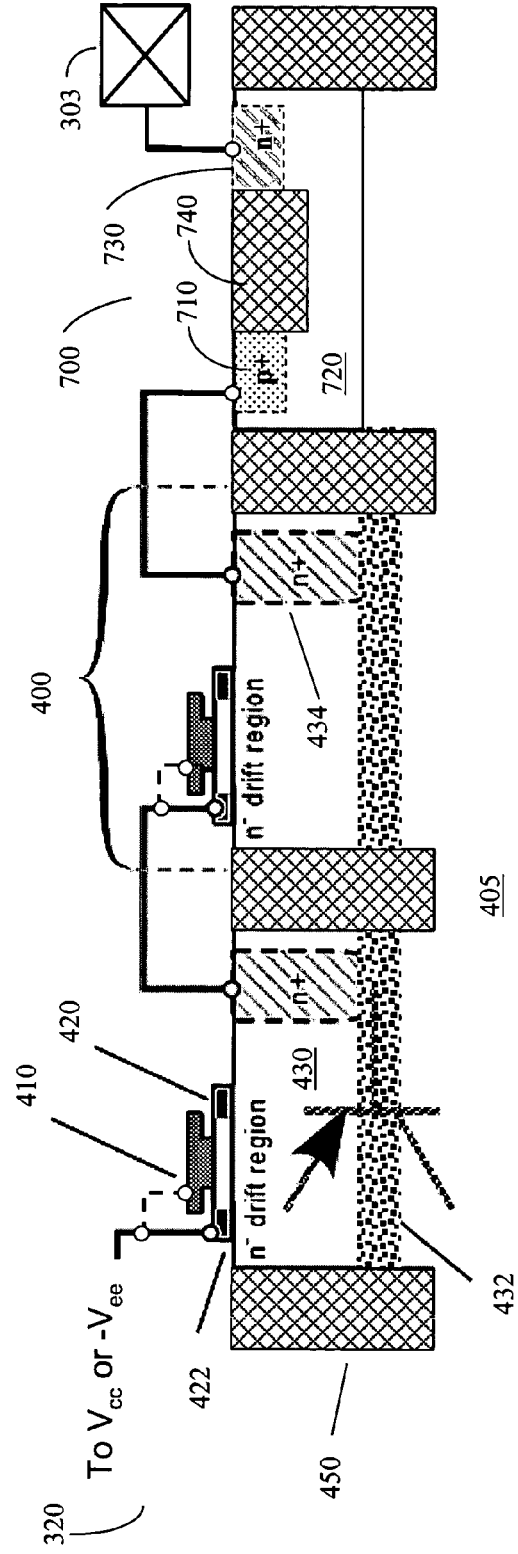
FIG. 7 is a block diagram of a modified negative polarity ESD protection structure built using SiGe BJT and at least one conventional diode according to one embodiment of the present invention.

The capacitance between the subcollector 432 and the substrate 405 in each SiGe BJT cell 400 in the negative polarity ESD protection structure 320 may cause undesirable degradation in the performance of the active circuit 301 being protected. To avoid this problem, at least one conventional N+P or P+N diode with a relative low capacitance should be included in the negative polarity ESD protection structure 320. As shown in FIG. 7, which illustrate a modified negative polarity ESD protection structure 320, a P+N diode 700 in the negative polarity ESD protection structure 320 is formed between a P+ diffusion 710, which is connected to the subcollector contact 434 of a neighboring SiGe BJT cell 400, and a N-well or N-drift region 720, which is connected to I/O pad 303 via a N+ contact 730. The P+ diffusion region 710 and the N+ contact 730 may be separated from a shallow trench isolation region 740. A N+P diode may also be used by replacing the N-well or N-drift region 720 with a P-well. The capacitance associated with each SiGe BJT cell 400 in the modified negative polarity ESD protection structure 320 appears in series with the capacitance of the conventional N+P or P+N diode. Since the capacitance of a series combination of capacitances is always less than the smallest capacitance in the series, the total parasitic capacitance in the modified negative polarity ESD protection structure 320 can thus be reduced to a small value, which no longer degrades performance of the active circuit 301 significantly.

Figures 8A, 8B:
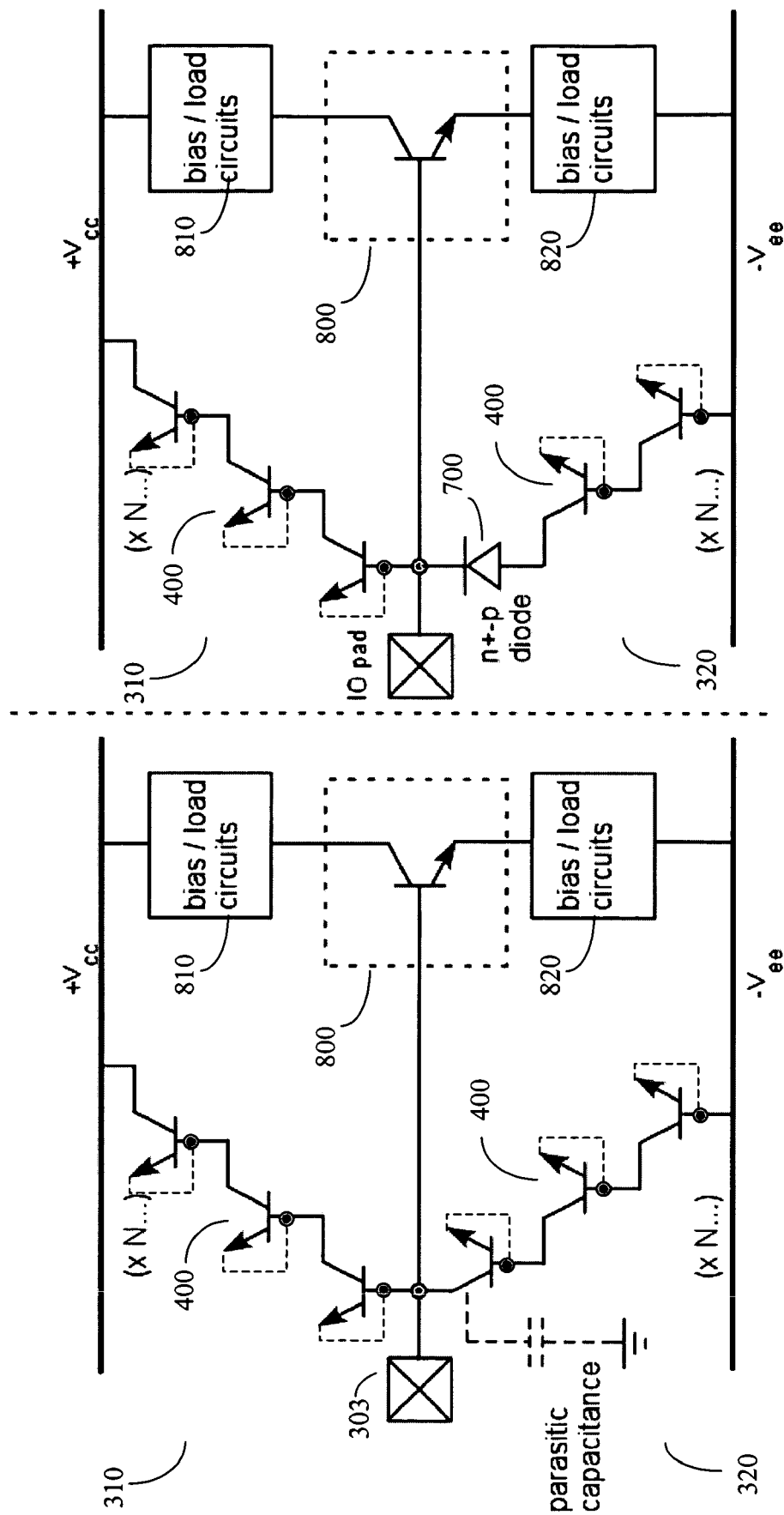
FIG. 8A is a circuit schematic of an input circuit utilizing both positive and negative polarity ESD protection structures according to one embodiment of the present invention.
FIG. 8B is a circuit schematic of an input circuit utilizing the positive polarity ESD protection structure and a modified negative polarity ESD protection structure according to one embodiment of the present invention.

FIG. 8A is a circuit schematic of a high-frequency amplifier 800 coupled to $V_{cc}$ via bias/load circuits 810, to $-V_{ee}$ via bias/load circuits 820, and to I/O pad 303. The amplifier 800 is protected from both positive and negative polarity ESD pulses on the I/O pad 303 by the positive polarity ESD protection structure 310 coupled between the I/O pad 303 and $V_{cc}$, and by the negative polarity ESD protection structure 320 coupled between the I/O pad 303 and $-V_{ee}$, respectively. Although FIG. 8A shows that the emitter of each SiGe BJT 400 in the positive and negative polarity ESD protection structures 310 and 320 are left floating, the emitter can be shorted to the SiGe base of the SiGe BJT 400. Also, the high-frequency amplifier 800 depicted in FIG. 8A is shown schematically, and may include a variety of provisions for biasing and control. Furthermore, although FIG. 8A shows that the I/O pad 303 and the protection structures 310 and 320 are connected to an input of the amplifier 800, (as such manner of connection may help reduce the impact of the parasitic capacitance associated with the negative polarity ESD protection structure 320 on the performance of the amplifier 800), the I/O pad 303 and the protection structures 310 and 320 may be connected to the output of the amplifier as well.

FIG. 8B illustrates the high-frequency amplifier 800 protected by the positive polarity ESD protection structure 310 and the modified negative polarity ESD protection structure 320. Because of the inclusion of the conventional diode cell 700 in the negative polarity ESD protection structure 320, the parasitic capacitance associated with the negative polarity ESD protection structure 320 can be significantly reduced.

Since the positive and negative polarity ESD protection structures 310 and 320 utilize existing, pre-characterized SiGe BJT transistor cells, the structures 310 and 320 can be fabricated within a standard SiGe BiCMOS process. Since the standard SiGe BiCMOS process typically include processing steps for forming the trench isolation regions 450, processing steps for forming the N-drift regions 430, processing steps for forming the N+ buried regions 432, processing steps for forming the N+ contact regions 434, processing steps for forming the SiGe base 420, processing steps for forming the emitter 420, and processing steps for forming contact metallization including conducting lines 460, 462, and 620, structures 310 and 320 can be fabricated with a standard SiGe BiCMOS process with no additional processing steps. Furthermore, no specialized structures, or additional characterization, are needed for the design, modeling, and implementation of these ESD structures 310 and 320, because the SiGe BJT cells 400 are well characterized for a standard BiCMOS process.

The following summarizes the benefits of using structures 310 and 320 according to embodiments of the present invention for ESD protection of high-performance I/O devices in a SiGe BiCMOS integrated circuit:

Structures 310 and 320 allow increased stacking without leakage current penalties and consequent degradation of turn-on voltage, and allow circuit designers to exploit the benefits of a stackable architecture;

The turn-on voltage structures 310 and 320 may be flexibly adjusted by choosing the number of stacked diodes, allowing the turn-on voltage to be easily placed between the breakdown voltage of the protected device and an expected maximum RF swing;

When connected to the positive supply rail, positive polarity ESD protection structure 310 can be designed to sustain input signal voltages greater than the positive rail voltage $V_{cc}$ on the input pad without triggering ESD protection, which is not possible with conventional bias clamps connected to the positive rail.

Input clamps to ground in both polarities at arbitrary voltage (within the practical limits of the diode stacked structures) can be constructed without requiring access to the positive rail voltage, thus simplifying the layout of the ESD protection circuitry by requiring only local connections without a power bus to $V_{cc}$.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An ESD protection device for protecting an active circuit coupled to an input/output (I/O) pad, comprising:
    stacked diodes coupled between the I/O pad and a positive or negative supply rail, the staked diodes being formed using a plurality of SiGe bipolar junction transistors (BJT) each having a P-type doped SiGe base formed over a substrate, wherein an anode of each diode is formed using the SiGe base of one of the SiGe bipolar junction transistors.

2. The ESD protection device of claim 1, wherein the plurality of SiGe bipolar junction transistors each further comprises an emitter that either floats or is connected to the base of the SiGe BJT.

3. The ESD protection device of claim 1, wherein the plurality of SiGe bipolar junction transistors comprise:
    a first SiGe BJT having its SiGe base coupled to the I/O pad; and
    a second SiGe BJT having its SiGe base coupled to a collector of the first SiGe BJT.

4. The ESD protection device of claim 3, wherein the plurality of SiGe bipolar junction transistors further comprise:
    a third SiGe BJT having a collector coupled to the positive or negative supply rail.

5. The ESD protection device of claim 1, wherein the plurality of SiGe bipolar junction transistors comprise:
    a first SiGe BJT having its SiGe base coupled to the positive or negative supply rail; and
    a second SiGe BJT having its SiGe base coupled to a collector of the first SiGe BJT.

6. The ESD protection device of claim 5, wherein the plurality of SiGe bipolar junction transistors further comprise:
    a third SiGe BIT having a collector coupled to the I/O pad.

7. The ESD protection device of claim 5, further comprising at lease one low-capacitance diode formed using diffusion regions in the substrate, the low-capacitance diode having a cathode coupled to the I/O pad and an anode coupled to a collector of one of the plurality of SiGe biopolar junction transistors.

8. The ESD protection device of claim 1, wherein each SiGe BJT further comprises a buried N+ diffusion region in the substrate as a subcollector of the SiGe BJT and a N+ contact diffusion region adjacent the buried N+ diffusion region as a subcollector contact of the SiGe BJT.

9. The ESD protection device of claim 8, wherein each SiGe BJT further comprises a N-drift region formed in the substrate between the buried N+ diffusion region and the SiGe base.

10. The ESD protection device of claim 9, wherein diffusion regions of each SiGe BJT are separated from diffusion regions of a neighboring BJT by a trench isolation region.

11. A mixed-signal SiGe BiCMOS circuit comprising:
    an input device coupled to an input pad; and
    an ESD protection device coupled between the input pad and a positive or negative supply rail, the ESD protection device comprising stacked diodes formed using a plurality of SiGe bipolar junction transistors (BJT) each having a SiGe base.

12. The circuit of claim 11, wherein the plurality of SiGe bipolar junction transistors each further comprises an emitter that either floats or is connected to the base of the SiGe BJT.

13. The circuit of claim 11, wherein the plurality of SiGe bipolar junction transistors comprise:
    a first SiGe BJT having its SiGe base coupled to the input pad; and
    a second SiGe BJT having its SiGe base coupled to a collector of the first SiGe BJT.

14. The circuit of claim 13, wherein the plurality of SiGe bipolar junction transistors further comprise:
    a third SiGe BJT having a collector coupled to the positive or negative supply rail.

15. The ESD protection device of claim 11, wherein the plurality of SiGe bipolar junction transistors comprise:
    a first SiGe BJT having its SiGe base coupled to the positive or negative supply rail; and
    a second SiGe BJT having its SiGe base coupled to a collector of the first SiGe BJT.

16. The circuit of claim 15, further comprising at least one low-capacitance diode having a cathode coupled to the I/O pad and an anode coupled to a collector of one of the plurality of SiGE bipolar junction transistors.

* * * * *